(12) United States Patent
Chen et al.

(10) Patent No.: US 11,961,743 B2
(45) Date of Patent: Apr. 16, 2024

(54) SUBSTRATE MANUFACTURING METHOD FOR REALIZING THREE-DIMENSIONAL PACKAGING

(71) Applicant: Zhuhai ACCESS Semiconductor Co., Ltd., Zhuhai (CN)

(72) Inventors: Xianming Chen, Zhuhai (CN); Yejie Hong, Zhuhai (CN); Benxia Huang, Zhuhai (CN); Lei Feng, Zhuhai (CN)

(73) Assignee: ZHUHAI ACCESS SEMICONDUCTOR CO., LTD., Zhuhai (CN)

( * ) Notice: Subject to any disclaimer, the term of this patent is extended or adjusted under 35 U.S.C. 154(b) by 369 days.

(21) Appl. No.: 17/544,999

(22) Filed: Dec. 8, 2021

(65) Prior Publication Data

US 2022/0189789 A1 Jun. 16, 2022

(30) Foreign Application Priority Data

Dec. 10, 2020 (CN) .......................... 202011433687.X (51) Int. Cl.
*H01L 21/48* (2006.01)
*H01L 25/16* (2023.01)

(52) U.S. Cl.
CPC ........ *H01L 21/4857* (2013.01); *H01L 21/486* (2013.01); *H01L 21/4871* (2013.01); *H01L 25/16* (2013.01)

(58) Field of Classification Search
CPC ... H01L 21/4857; H01L 21/48; H01L 21/486; H01L 21/4871; H01L 23/49822; H01L 23/498; H01L 23/13; H01L 23/5389; H01L 23/538; H01L 25/16; H01L 25/00; H01L 25/18; H05K 3/4697; H05K 3/46; H05K 3/4007; H05K 3/4092; H05K 3/24; H05K 3/3457; H05K 3/40; H05K 3/4611; H05K 3/4652; H05K 1/111; H05K 1/11; H05K 1/115; H05K 1/112; H05K 1/185
See application file for complete search history.

(56) References Cited

U.S. PATENT DOCUMENTS

| | | | |
|---|---|---|---|
| 8,941,244 B1 * | 1/2015 | Tsai | H01L 23/49827 |
| | | | 257/664 |
| 10,765,005 B2 * | 9/2020 | Stahr | H01L 24/19 |
| 11,494,682 B2 * | 11/2022 | Elsherbini | H01L 25/18 |
| 11,626,363 B2 * | 4/2023 | Haba | H01G 4/30 |
| | | | 361/301.4 |
| 11,889,622 B2 * | 1/2024 | Weis | H05K 3/368 |

* cited by examiner

*Primary Examiner* — Nikolay K Yushin
(74) *Attorney, Agent, or Firm* — Grossman, Tucker, Perreault & Pfleger PLLC; Paul J. Kroon, Jr.

(57) ABSTRACT

Disclosed is a substrate manufacturing method for realizing three-dimensional packaging, which includes: preparing a base plate, the base plate including a dielectric material layer, a first sidewall pad, a first through-hole pillar and a cavity, the cavity being filled with a first metal block; processing a first circuit layer and a second circuit layer, the first circuit layer including a first padding plate and a second metal block, and the second circuit layer including a second padding plate and a plurality of pin pads; processing and laminating interlayer through-hole pillars; processing a third circuit layer and a fourth circuit layer, the third circuit layer including a second sidewall pad and the fourth circuit layer including a routing circuit; and etching to expose the first sidewall pad, the second sidewall pad and the pin pads.

20 Claims, 8 Drawing Sheets

SUBSTRATE MANUFACTURING METHOD FOR REALIZING THREE-DIMENSIONAL PACKAGING

CROSS-REFERENCE TO RELATED APPLICATION

This application claims benefit of priority to Chinese patent application No. 202011433687.X filed Dec. 10, 2020, the entire content of which is incorporated herein by reference.

TECHNICAL FIELD

The present disclosure relates to the field of circuit board technologies, and more particularly, to a substrate manufacturing method for realizing three-dimensional packaging.

BACKGROUND

With the increasing development of electronic technologies, the performance requirements of electronic products are getting higher and higher. In order to realize the multifunction and high performances of electronic products, it is the development trend to package multiple active and passive devices with different functions to realize a more powerful chip module at present and in the future, which not only reduces the space of electronic products, but also shortens distances between different components and improves the operation speed of the chip.

Currently, the active device packaging technology includes a horizontal packaging structure in which multiple chips are spread out and a vertical packaging structure in which multiple chips are stacked and packaged in the vertical direction. However, both the horizontal and vertical packaging structures have the following disadvantages:
1) Pads on a circuit board substrate are all in the same circuit layer, so the design freedom will be limited.
2) The occupation area of the circuit board substrate is large, which limits the development trend of miniaturization and high integration of the package.
3) Components and parts are densely arranged or stacked on one side, which reduces the heat dissipation effect.

SUMMARY

The present disclosure aims at solving at least one of the technical problems in the prior art. To this end, the present disclosure provides a substrate manufacturing method for realizing three-dimensional packaging, which is capable of improving a space utilization rate of a package.

A substrate manufacturing method for realizing three-dimensional packaging according to an embodiment of the present disclosure comprises:
preparing a base plate, wherein the base plate comprises a dielectric material layer, a first sidewall pad and a first through-hole pillar arranged on the dielectric material layer, and a cavity penetrating both sides of the dielectric material layer, the cavity is filled with a first metal block, an anti-etching barrier layer is arranged between the first metal block and the dielectric material layer and at a bottom portion of the first metal block, the cavity is provided with at least one plane sidewall, and the first sidewall pad is located at one side of the plane sidewall and connected with the anti-etching barrier layer;
processing a first circuit layer and a second circuit layer on the base plate, wherein the first circuit layer comprises a first padding plate and a second metal block, the second circuit layer comprises a second padding plate and a plurality of pin pads, positions of the first padding plate and the second padding plate are all matched with the first through-hole pillar, the second metal block covers above the cavity, and the plurality of pin pads are located at a bottom portion of the cavity;
processing and laminating interlayer through-hole pillars on the first circuit layer, wherein the interlayer through-hole pillars comprise a first interlayer through-hole pillar, a second interlayer through-hole pillar, a third interlayer through-hole pillar and a fourth interlayer through-hole pillar, the first interlayer through-hole pillar is arranged on the first padding plate, the second interlayer through-hole pillar is arranged on the second metal block, the third interlayer through-hole pillar is arranged on the second padding plate, and the fourth interlayer through-hole pillar is arranged on at least one of the pin pads;
processing a third circuit layer and a fourth circuit layer on the semi-finished product obtained after laminating, wherein the third circuit layer comprises a second sidewall pad, a position of the second sidewall pad is matched with the first sidewall pad, and the second sidewall pad is connected with the first interlayer through-hole pillar, the fourth circuit layer comprises a routing circuit, and the routing circuit is respectively connected with the third interlayer through-hole pillar and the fourth interlayer through-hole pillar; and
etching the second interlayer through-hole pillar, the second metal block, the first metal block and the anti-etching barrier layer respectively to expose the first sidewall pad, the second sidewall pad and the pin pads.

The substrate manufacturing method for realizing three-dimensional packaging according to the embodiment of the present disclosure at least has the following beneficial effects: according to the embodiment of the present disclosure, side pads such as the first side pad and the second side pad may be formed on the side wall of the cavity, so that the pads do not need to be confined in the same circuit layer, which provides greater freedom for the circuit design of products, and can package active and passive devices in the cavity, thus effectively reducing the space of the package and improving the space utilization rate of the package.

According to some embodiments of the present disclosure, the processing the first circuit layer and the second circuit layer on the base plate comprises: manufacturing a first seed layer on the base plate; and processing the first circuit layer and the second circuit layer on the first seed layer by pattern transfer and pattern electroplating.

According to some embodiments of the present disclosure, the processing the interlayer through-hole pillars on the first circuit layer comprises: processing the interlayer through-hole pillars on the first circuit layer and the second circuit layer by pattern transfer and pattern electroplating; and etching the first seed layer to obtain a circuit pattern matched with the first circuit layer and the second circuit layer.

According to some embodiments of the present disclosure, the processing the third circuit layer and the fourth circuit layer on the semi-finished product obtained after laminating comprises: manufacturing a second seed layer on the semi-finished product obtained after laminating; and processing the third circuit layer and the fourth circuit layer on the second seed layer by pattern transfer and pattern electroplating.

According to some embodiments of the present disclosure, after etching the second interlayer through-hole pillar, the second metal block, the first metal block and the anti-etching barrier layer respectively, the method further comprises: performing solder resist treatment on the third circuit layer and the fourth circuit layer; and performing metal surface treatment on the first sidewall pad, the second sidewall pad and the pin pads.

According to some embodiments of the present disclosure, after the performing solder resist treatment on the third circuit layer and the fourth circuit layer, the method further comprises: welding a passive device on the sidewall of the cavity, wherein pins of the passive device are respectively connected with the first sidewall pad and the second sidewall pad; welding an active device in the cavity, wherein pins of the active device are respectively connected with the pin pads; and packaging the cavity welded with the passive device and the active device.

According to some embodiments of the present disclosure, the manufacturing method of the base plate comprises: preparing a double-sided copper foil substrate, and manufacturing a third seed layer on the double-sided copper foil substrate; processing the first sidewall pad and the first through-hole pillar on the double-sided copper foil substrate with the third seed layer; manufacturing a photosensitive shielding layer on the double-sided copper foil substrate with the first sidewall pad and the first through-hole pillar to form the cavity, and electroplating the anti-etching barrier layer in the cavity; electroplating on the anti-etching barrier layer to form the first metal block; removing the photosensitive shielding layer and laminating a dielectric material to obtain the dielectric material layer; and thinning and then dividing the dielectric material layer into plates to obtain the base plate.

According to some embodiments of the present disclosure, the manufacturing the third seed layer on the double-sided copper foil substrate comprises: plating nickel on the double-sided copper foil substrate to obtain a protective metal layer; and plating copper on the protective metal layer to obtain the third seed layer.

According to some embodiments of the present disclosure, the first sidewall pad is a copper pillar with a square cross section.

According to some embodiments of the present disclosure, the first through-hole pillar is a cylindrical copper pillar.

Additional aspects and advantages of the present disclosure will be given in part in the following description, and will become apparent in part from the following description, or will be learned through the practice of the present disclosure.

BRIEF DESCRIPTION OF THE DRAWINGS

The above and/or additional aspects and advantages of the present disclosure will be more apparent from the following description of certain preferred embodiments taken in conjunction with the accompanying drawings, wherein:

FIG. 16b is a schematic plan view of the semi-finished product shown in FIG. 16a;

FIG. 18b is a schematic plan view of the semi-finished product shown in FIG. 18a;

DETAILED DESCRIPTION

The embodiments of the present disclosure will be described in detail hereinafter. Examples of the embodiments are shown in the accompanying drawings. The same or similar reference numerals throughout the drawings denote the same or similar elements or elements having the same or similar functions. The embodiments described below with reference to the accompanying drawings are exemplary and are only intended to explain the present disclosure, but should not be construed as limiting the present disclosure.

In the description of the present disclosure, it should be understood that the orientation or positional relationship indicated by the terms "vertical", "upper", "lower", "horizontal", "inner" and the like is based on the orientation or positional relationship shown in the drawings, only for the convenience of describing the present disclosure and simplifying the description, and does not indicate or imply that the indicated device or element must have a specific orientation, or be constructed and operated in a specific orientation. Therefore, the terms should not be construed as limiting the present disclosure.

In the description of the present disclosure, the meaning of several refers to be one or more, and the meaning of multiple refers to be more than two. The meanings of greater than, less than, more than, etc., are understood as not including this number, while the meanings of above, below, within, etc., are understood as including this number. If there is a description to the first and second, it is only for the purpose of distinguishing technical features, and shall not be understood as indicating or implying relative importance, implicitly indicating the number of the indicated technical features or implicitly indicating the order of the indicated technical features.

In the description of the present disclosure, unless otherwise clearly defined, words such as setting, installation, connection, etc., shall be understood broadly, and those skilled the art can reasonably determine the specific meanings of the above words in the present disclosure in combination with the specific contents of the technical solution.

In the description of the present disclosure, the method steps are numbered consecutively for the convenience of examination and understanding. Combining with the overall technical solutions of the present disclosure and the logical relationship among the steps, adjusting the implementation order among the steps will not affect the technical effects achieved by the technical solutions of the present disclosure.

Figure 1:
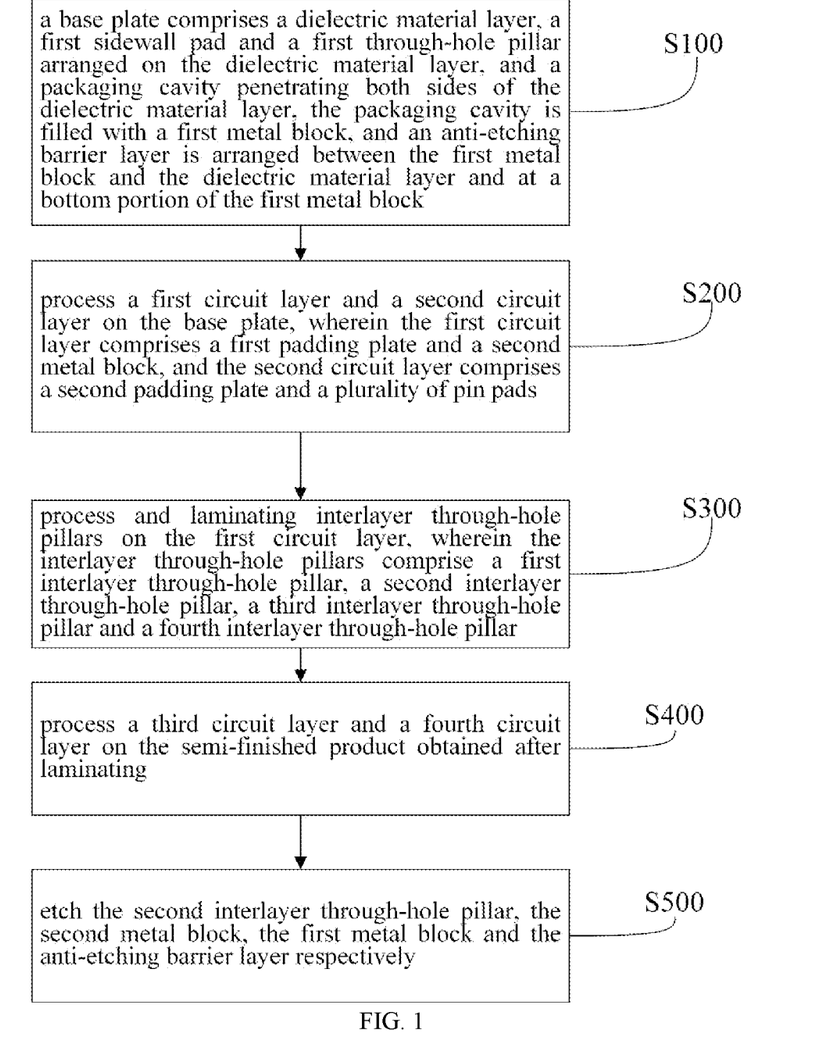
FIG. 1 is a flowchart of steps of a substrate manufacturing method for realizing three-dimensional packaging according to an embodiment of the present disclosure.

Referring to FIG. 1, this embodiment discloses a substrate manufacturing method for realizing three-dimensional packaging, wherein some manufacturing steps, such as pattern transfer, photoresist deposition, exposure and subsequent removing steps, pattern electroplating, and the like, are not discussed in detail here, because the materials and technological processes in these steps are well-known technologies which, if discussed in detail here, will make this description be very cumbersome. That is to say, when designing corresponding steps for a particular product, those skilled in the field can make appropriate choices from various alternative materials and manufacturing processes based on a clear understanding of parameters such as production batch, substrate complexity and device resolution.

The substrate manufacturing method for realizing three-dimensional packaging according to this embodiment comprises the following steps.

Figure 2:
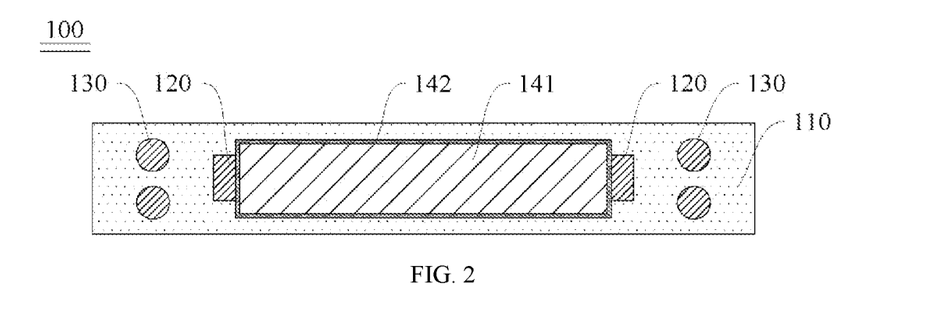
FIG. 2 is a top view of a base plate of the substrate manufacturing method for realizing three-dimensional packaging according to the embodiment of the present disclosure.
Figure 3:
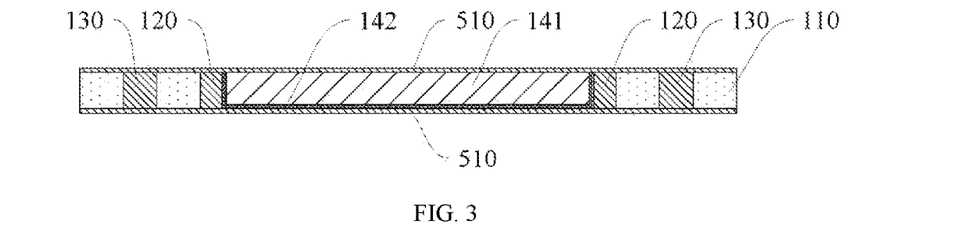
FIG. 3 is a schematic structural diagram of a semi-finished product obtained by processing a first seed layer on the base plate shown in FIG. 2.

At S100, a base plate 100 is prepared. Referring to FIG. 2 and FIG. 3, the base plate 100 comprises a dielectric material layer 110, a first sidewall pad 120 and a first through-hole pillar 130 arranged on the dielectric material layer 110, and a cavity penetrating both sides of the dielectric material layer 110, the cavity is filled with a first metal block 141, an anti-etching barrier layer 142 is arranged between the first metal block 141 and the dielectric material layer 110 and at a bottom portion of the first metal block 141, the cavity is provided with at least one plane sidewall, and the first sidewall pad 120 is located at one side of the plane sidewall and connected with the anti-etching barrier layer 142.

It should be noted that, in this step, the first sidewall pad 120 is used as one of the pads for subsequent soldering of passive devices 810 (such as resistors and capacitors), the first through-hole pillar 130 is used as a conductor for conducting different circuit layers, and the first metal block 141 is convenient for subsequent cavity formation by etching, wherein the number of the first sidewall pad 120, the first through-hole pillar 130 and the first metal block 141 may be designed as one or more according to production data. The base plate 100 shown in the figure has a bilaterally symmetrical structure, in which the number of the first sidewall pad 120 is two, the number of the first through-hole pillar 130 is four, and the number of the first metal block 141 is one. For convenience of description, the following description will refer to the structure of one side of the base plate 100.

Figure 4:
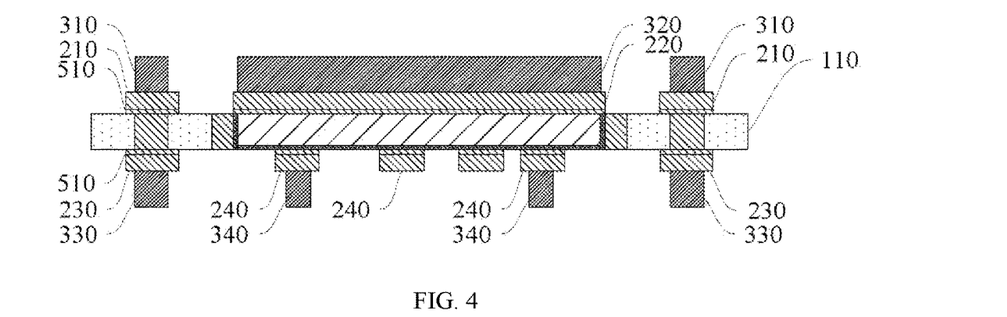
FIG. 4 is a schematic structural diagram of the semi-finished product shown in FIG. 3 after processing interlayer through-hole pillars on the semi-finished product.

At S200, a first circuit layer and a second circuit layer are processed on the base plate 100. Referring to FIG. 3 and FIG. 4, the first circuit layer and the second circuit layer are respectively located on upper and lower surfaces of the base plate 100. The first circuit layer comprises a first padding plate 210 and a second metal block 220. The second circuit layer comprises a second padding plate 230 and a plurality of pin pads 240. Positions of the first padding plate 210 and the second padding plate 230 are both matched with to the first through-hole pillar 130. For example, the first padding plate 210 is located directly above the first through-hole pillar 130, the second padding plate 230 is located directly under the first through-hole pillar 130, and sizes of the first padding plate 210 and the second padding plate 230 meet the padding plate design size requirements of a circuit board, so as to facilitate the subsequent processing of interlayer through-hole pillars on the first padding plate 210 and the second padding plate 230, so as to realize conduction between different circuit layers. The second metal block 220 covers above the cavity, and a plurality of pin pads 240 are all located at a bottom portion of the cavity, wherein positions and sizes of the pin pads 240 are matched with pins of the active device 820 (such as an integrated chip) to be soldered later.

Referring to FIG. 3 and FIG. 4, in the S200 mentioned above, the processing the first circuit layer and the second circuit layer on the base plate 100 comprises the following steps.

At S210, a first seed layer 510 is manufactured on the base plate 100, wherein the first seed layer 510 may be manufactured by ion sputtering or chemical deposition.

At S220, the first circuit layer and the second circuit layer are processed on the first seed layer 510 by pattern transfer and pattern electroplating. The first seed layer 510 is advantageous for improving a binding force between the first circuit layer and the second circuit layer.

Figure 5:
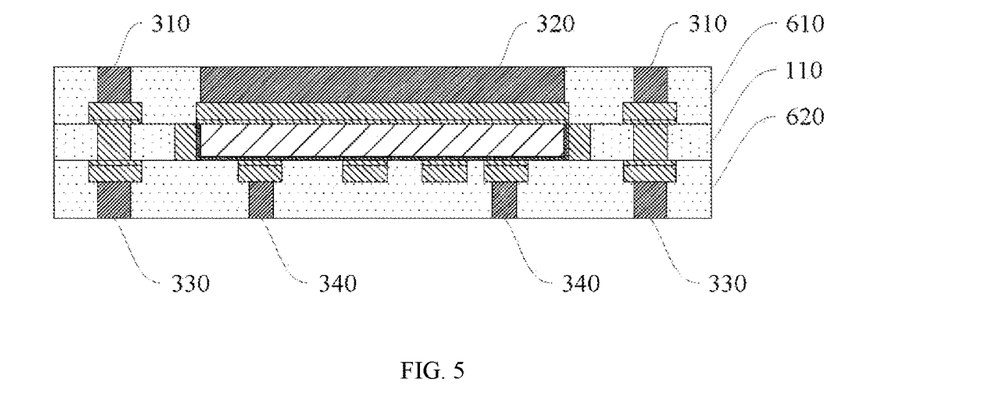
FIG. 5 is a schematic structural diagram of the semi-finished product shown in FIG. 4 after laminating.

At S300, the interlayer through-hole pillars are processed on the first circuit layer and then laminated. Referring to FIG. 4 and FIG. 5, the interlayer through-hole pillars comprise a first interlayer through-hole pillar 310, a second interlayer through-hole pillar 320, a third interlayer through-hole pillar 330 and a fourth interlayer through-hole pillar 340. The first interlayer through-hole pillar 310 is arranged on the first padding plate 210, the second interlayer through-hole pillar 320 is arranged on the second metal block 220, the third interlayer through-hole pillar 330 is arranged on the second padding plate 230, and the fourth interlayer through-hole pillar 340 is arranged on at least one pin pad 240, wherein the first interlayer through-hole pillar 310, the first through-hole pillar 130 and the third interlayer through-hole pillar 330 are matched to be capable of conducting the circuits in different layers, and the fourth interlayer through-hole pillar 340 is conducted with a corresponding pin pad 240, so as to facilitate the subsequent signal transmission between the active device 820 and a passive device 810 through a routing circuit 420. After the interlayer through-hole pillars are obtained by processing, according to the lamination design requirements, a first lamination layer 610 and a second lamination layer 620 are obtained by laminating a dielectric material (such as prepreg). After laminating, the dielectric material can be thinned by grinding plates or the like to expose the interlayer through-hole pillars. It should be noted that the number of layers of the interlayer through-hole pillars may be one or more layers, and the number of layers of the interlayer through-hole pillars shown in FIG. 5 is one layer. According to the size requirements of different passive devices, those skilled in the art can process a next layer of interlayer through-hole pillars on the basis of circuit of the previous layer of interlayer through-hole pillars until the designed thickness requirements are met.

In the S300 mentioned above, the processing the interlayer through-hole pillars on the first circuit layer comprises the following steps.

At S310, the interlayer through-hole pillars are processed on the first circuit layer and the second circuit layer by pattern transfer and pattern electroplating.

At S320, the first seed layer 510 is etched to obtain a circuit pattern matched with the first circuit layer and the second circuit layer.

Figure 6:
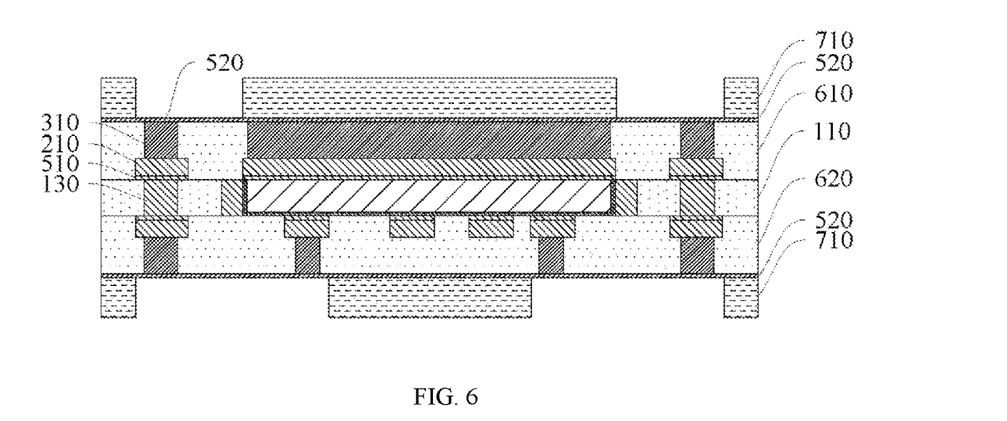
FIG. 6 is a schematic structural diagram of the semi-finished product shown in FIG. 5 after pasting a photosensitive shielding material.
Figure 7:
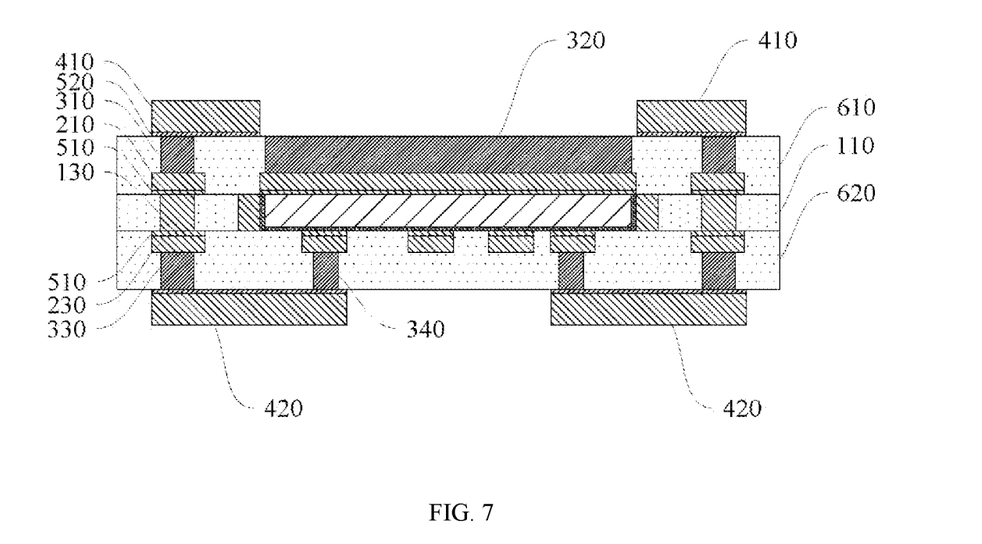
FIG. 7 is a schematic structural diagram of the semi-finished product shown in FIG. 6 after pattern electroplating.

At S400, a third circuit layer and a fourth circuit layer are processed on the semi-finished product obtained after laminating. Referring to FIG. 6 and FIG. 7, the third circuit layer comprises a second sidewall pad 410, a position of the second sidewall pad 410 is matched with the first sidewall pad 120, and the second sidewall pad 410 is connected with the first interlayer through-hole pillar 310. The fourth circuit layer comprises the routing circuit 420, and the routing circuit 420 is connected with the third interlayer through-hole pillar 330 and the fourth interlayer through-hole pillar 340 respectively. It should be noted that the second sidewall pad 410 of this embodiment may be directly connected with the first interlayer through-hole pillar or indirectly connected with the first interlayer through-hole pillar 310 through corresponding routing.

Referring to FIG. 5 and FIG. 6, in the S400 mentioned above, the processing the third circuit layer and the fourth circuit layer on the semi-finished product obtained after laminating comprises the following steps.

At S410, a second seed layer 520 is manufactured on the semi-finished product obtained after laminating.

At S420, the third circuit layer and the fourth circuit layer are processed on the second seed layer 520 by pattern transfer and pattern electroplating. After the pattern electroplating is completed to obtain the third circuit layer and the fourth circuit layer, the second seed layer 520 is etched to obtain the circuit pattern matched with the third circuit layer and the fourth circuit layer.

Specifically, referring to FIG. 6 and FIG. 7, a first photosensitive shielding material 710 is pasted on the third circuit layer and the fourth circuit layer, and preliminary patterns of the second sidewall pad 410 and the routing circuit 420 are obtained by pattern transfer and pattern electroplating, then the first photosensitive shielding material 710 is removed, and the second seed layer 520 is etched to obtain the second sidewall pad 410 and the routing circuit 420.

Figure 8:
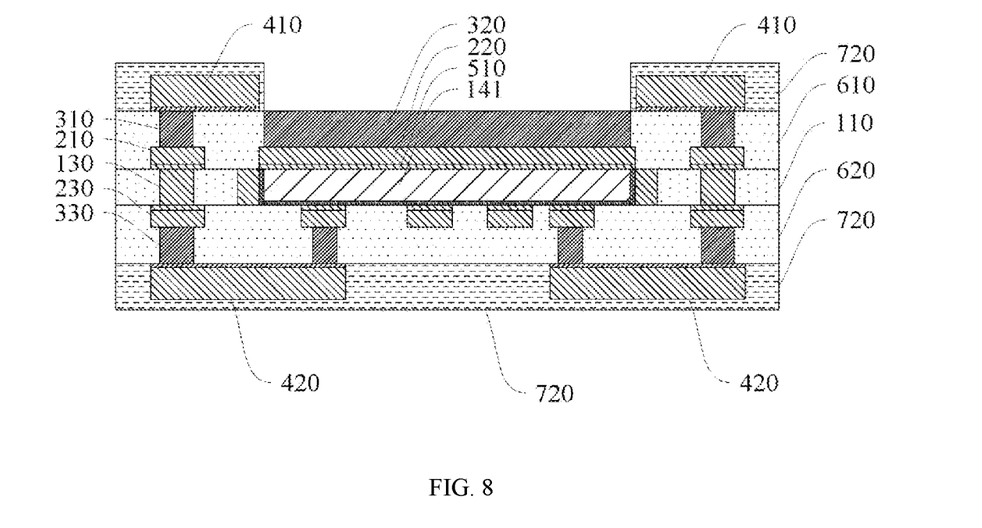
FIG. 8 is a schematic structural diagram of the semi-finished product shown in FIG. 7 after pasting a photosensitive shielding material.
Figure 9:
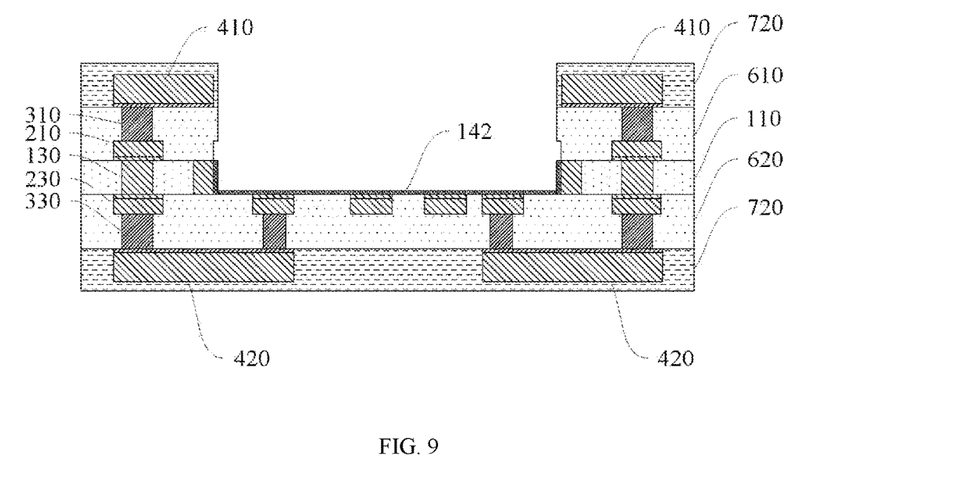
FIG. 9 is a schematic structural diagram of the semi-finished product shown in FIG. 8 after etching a second interlayer via pillar, a second metal block and a first metal block.
Figure 10:
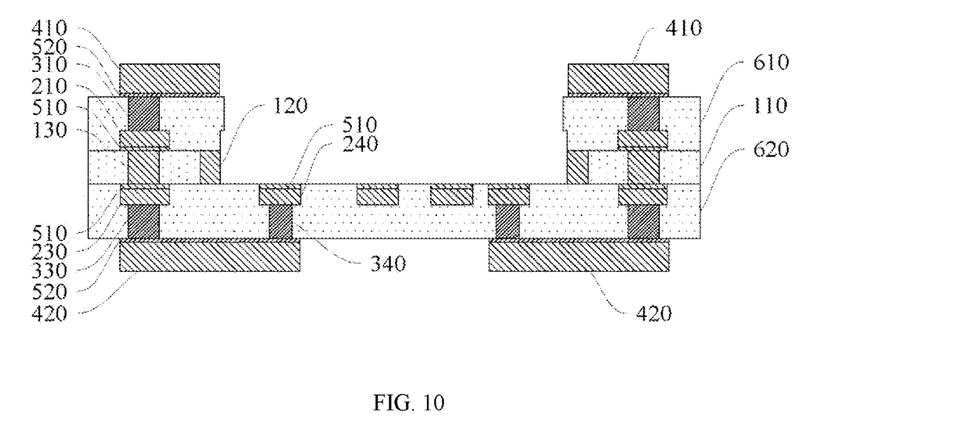
FIG. 10 is a schematic structural diagram of the semi-finished product shown in FIG. 9 after etching a first seed layer.

At S500, the second interlayer through-hole pillar 320, the second metal block 220, the first metal block 141 and the anti-etching barrier layer 142 are etched respectively to expose the first sidewall pad 120, the second sidewall pad 410 and the pin pads 240. Specifically, referring to FIG. 8, FIG. 9 and FIG. 10, a second photosensitive shielding material 720 is pasted on the third circuit layer and the fourth circuit layer, and a pattern is manufactured so as to open a window on the second interlayer through-hole pillar 320, and etch the second interlayer through-hole pillar 320, the second metal block 220 and the first metal block 141 with a first etching liquid medicine until the anti-etching barrier layer 142 is exposed, and then a second etching liquid medicine is used to etch the anti-etching barrier layer 142 to remove the second photosensitive shielding material 720. It should be noted that the second interlayer through-hole pillar 320, the second metal block 220 and the first metal block 141 of this embodiment are all copper blocks, and the anti-etching barrier layer 142 is made of nickel alloy. Therefore, both the first etching liquid medicine may be liquid medicines commonly used in the circuit board processing process, and the specific models and ingredients of the liquid medicines will not be described again.

In the above embodiment, the second sidewall pad 410 and the first sidewall pad 120 may be used as pads for passive device connection, and the plurality of pin pads 240 may be used for soldering the active device 820. The first interlayer through-hole pillar 310, the first through-hole pillar 130, the third interlayer through-hole pillar 330, the fourth interlayer through-hole pillar 340 and the routing circuit 420 form a conductive path between the pin pads 240 and the second sidewall pad 410, which enables signal transmission between the passive device and the active device to be soldered later. In this embodiment, the first sidewall pad 120 and the second sidewall pad 410 are respectively located on different circuit layers, so that the pad design of the circuit board does not need to be limited to the same circuit layer, which provides greater freedom for the circuit design of the product. The active and passive devices may be packaged in the cavity, effectively reducing a space of the package and improving a space utilization rate of the package. Moreover, by reasonably designing sizes of the cavity and the pad, horizontal and vertical packaging of the active and passive devices can coexist, and a package volume can be further reduced.

After etching the second interlayer through-hole pillar 320, the second metal block 220, the first metal block 141 and the anti-etching barrier layer 142 respectively in the S500 mentioned above, the method further comprises the following steps.

At S610, solder resist treatment is performed on the third circuit layer and the fourth circuit layer. Please refer to FIG. 11, in which a solder resist layer 730 covers outer circuit layers, i.e., the third circuit layer and the fourth circuit layer, to protect the circuits.

Figure 11:
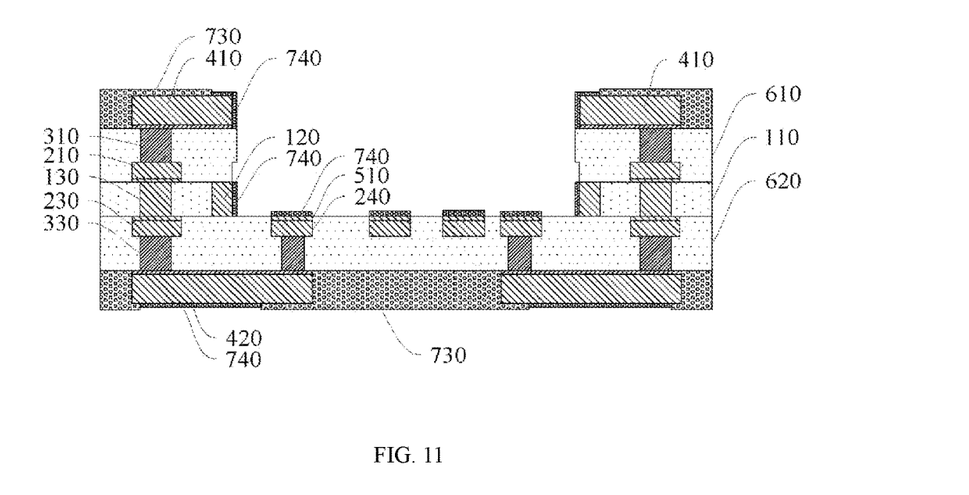
FIG. 11 is a schematic structural diagram of the semi-finished product shown in FIG. 10 after solder resist and metal surface treatment.

At S620, metal surface treatment is performed on the first sidewall pad 120, the second sidewall pad 410 and the pin pads 240 to obtain a protective layer 740. The metal surface treatment methods comprise oxidation resistance, nickel palladium plating, tin plating or silver plating, and the like.

After performing solder resist treatment on the third circuit layer and the fourth circuit layer in the S620 mentioned above, the method further comprises the following steps.

Figure 12:
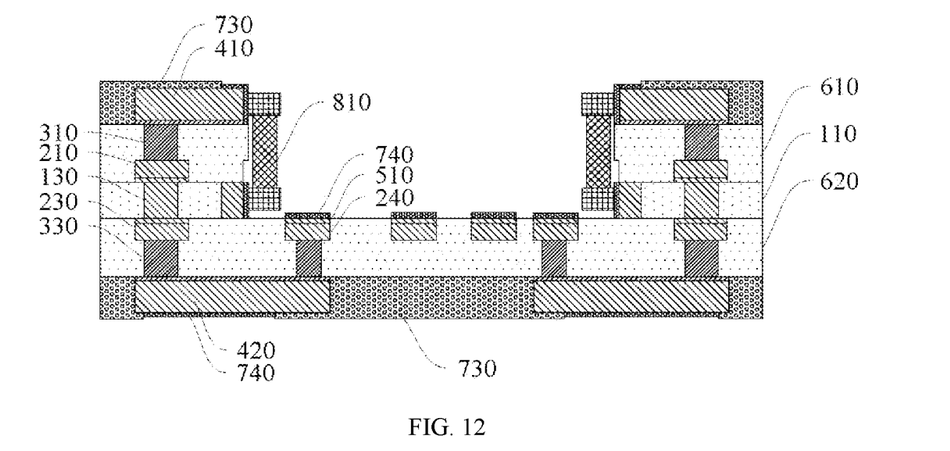
FIG. 12 is a schematic structural diagram of the semi-finished product shown in FIG. 11 after welding a passive device.

Referring to FIG. 12, at S710, the passive device 810 is welded on the sidewall of the cavity, and pins of the passive device 810 are respectively connected with the first sidewall pad 120 and the second sidewall pad 410.

Figure 13:
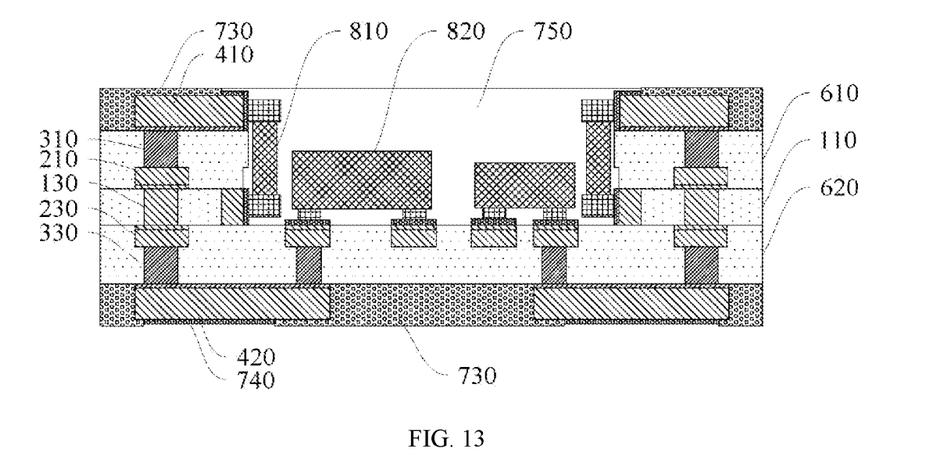
FIG. 13 is a schematic structural diagram of the semi-finished product shown in FIG. 12 after welding an active device and packaging.

Referring to FIG. 13, at S720, the active device 820 is welded in the cavity, and pins of the active device 820 are respectively connected with the pin pads 240.

At S730, the cavity welded with the passive device 810 and the active device 820 is packaged to obtain a packaging layer 750, thus protecting the passive device 810 and the active device 820, and improving an aesthetic degree of the product.

In the foregoing embodiment, the manufacturing method of the base plate 100 comprises the following steps.

Figure 14:
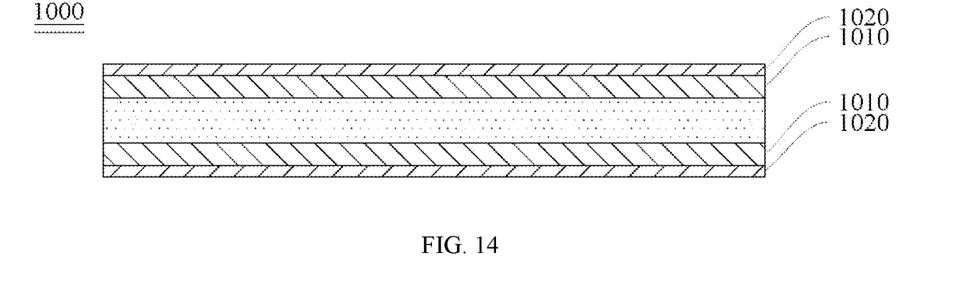
FIG. 14 is a schematic structural diagram of a double-sided copper foil substrate of the substrate manufacturing method for realizing three-dimensional packaging according to the embodiment of the present disclosure.

At S110, a double-sided copper foil substrate 1000 is prepared, and a third seed layer 1040 is manufactured on the double-sided copper foil substrate 1000. Referring to FIG. 14, the double-sided copper foil substrate 1000 is used as an initial layer, so that two base plates 100 may be manufactured on both the upper and lower surfaces simultaneously, which is advantageous for improving the production efficiency. Each side of the double-sided copper foil substrate 1000 of this embodiment is provided with two layers of copper foil, namely a first copper foil layer 1010 and a second copper foil layer 1020. A thickness of the copper foil depends on the application requirements. The seed layer of this embodiment is a copper layer, which may be processed by electroless plating. A thickness of the copper layer may be determined according to actual requirements. The thickness of the copper layer of this embodiment is 3 μm.

Figure 15:
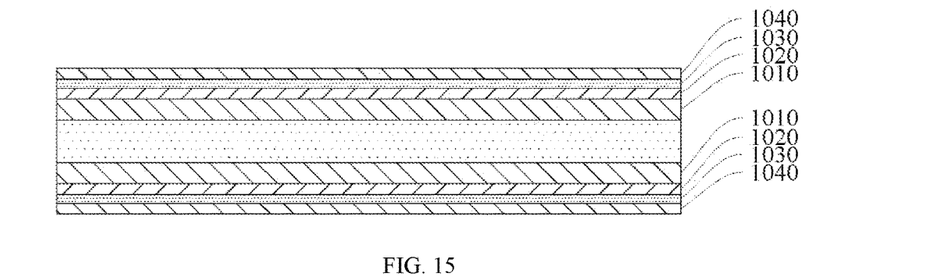
FIG. 15 is a schematic structural diagram of a semi-finished product obtained by processing a third seed layer on the double-sided copper foil substrate shown in FIG. 14.

Referring to FIG. 15, in the S110 mentioned above, the manufacturing the third seed layer 1040 on the double-sided copper foil substrate 1000 comprises the following steps.

At S111, nickel is plated on the double-sided copper foil substrate 1000 to obtain a protective metal layer 1030.

At S112, copper is plated on the protective metal layer 1030 to obtain the third seed layer 1040. The third seed layer 1040 can improve a bonding force of subsequent layers, while the protective metal layer 1030 can protect a pattern of the substrate and prevent over-etching when the third seed layer 1040 is etched after a subsequent plate dividing process.

Figure 16A:
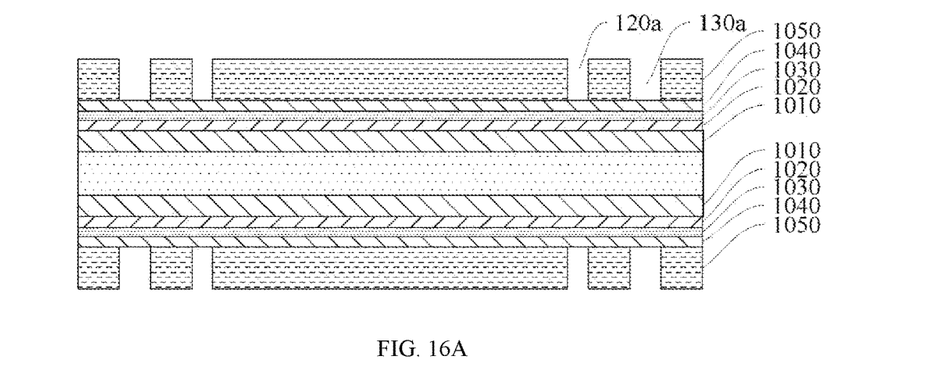
FIG. 16a is a schematic structural diagram of the semi-finished product shown in FIG. 15 after pasting a photosensitive shielding material.
Figure 16B:
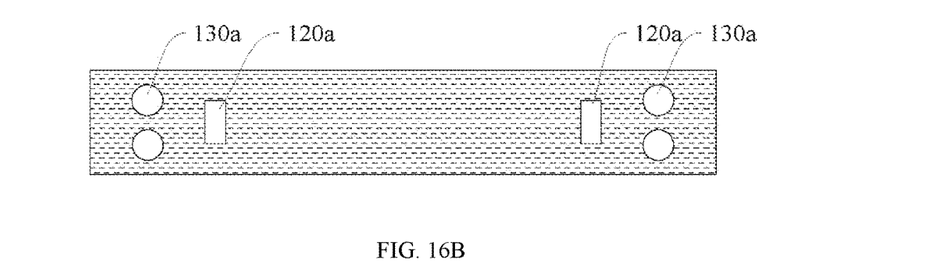

At S120, the first sidewall pad 120 and the first through-hole pillar 130 are processed on the double-sided copper foil substrate 1000 with the third seed layer 1040. Specifically, referring to FIG. 16a and FIG. 16b, a third photosensitive shielding material 1050 is pasted on the third seed layer 1040, and a first pattern hole 120a and a second pattern hole 130a respectively corresponding to the first sidewall pad 120 and the first through-hole pillar 130 are processed on the third seed layer 1040 by pattern transfer, and the first sidewall pad 120 and the first through-hole pillar 130 are processed on the double-sided copper foil substrate 1000 by pattern electroplating. The first sidewall pad 120 shown in the figure is a copper pillar with a square cross section, which is convenient for forming a flat welding surface and facilitating the subsequent welding of passive devices. The first through-hole pillar 130 is a cylindrical copper pillar, which is beneficial to reduce the subsequent size design difficulty of the first padding plate 210 and the second padding plate 230.

Figure 17:
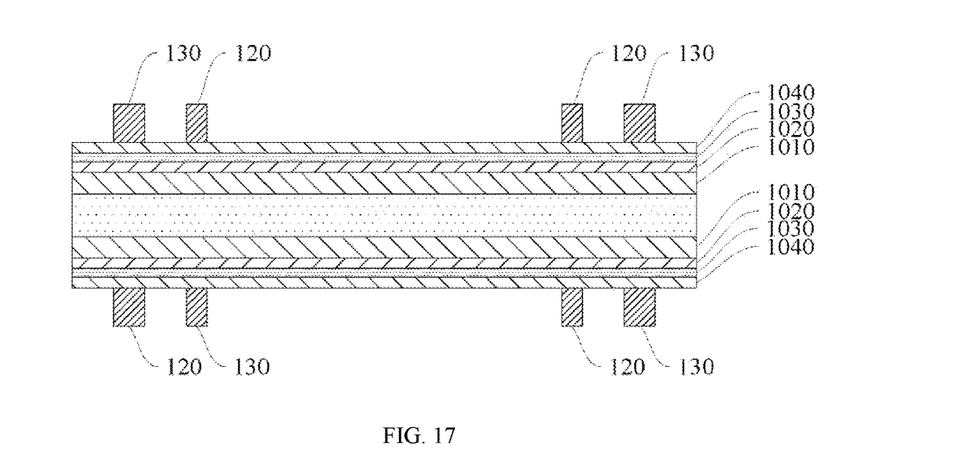
FIG. 17 is a schematic structural diagram of the semi-finished product shown in FIG. 16a after pattern electroplating.
Figure 18A:
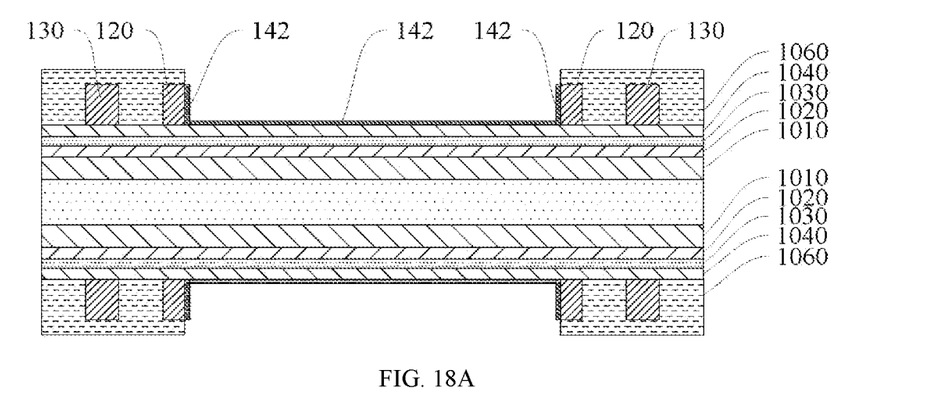
FIG. 18a is a schematic structural diagram of the semi-finished product shown in FIG. 17 after electroplating an anti-etching barrier layer.
Figure 18B:
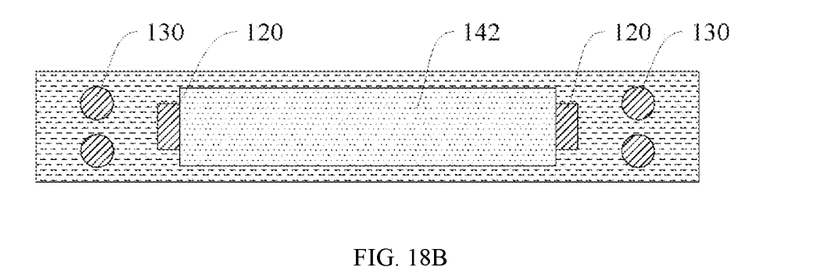

At S130, referring to FIG. 17, FIG. 18a and FIG. 18b, a fourth photosensitive shielding material 1060 is pasted on the double-sided copper foil substrate 1000 with the first sidewall pad 120 and the first through-hole pillar 130, so as to make a photosensitive shielding layer, thereby forming a cavity, and electroplating the anti-etching barrier layer 142 in the cavity. Specifically, the anti-etching barrier layer 142 of this embodiment is formed by nickel alloy electroplating.

Figure 19:
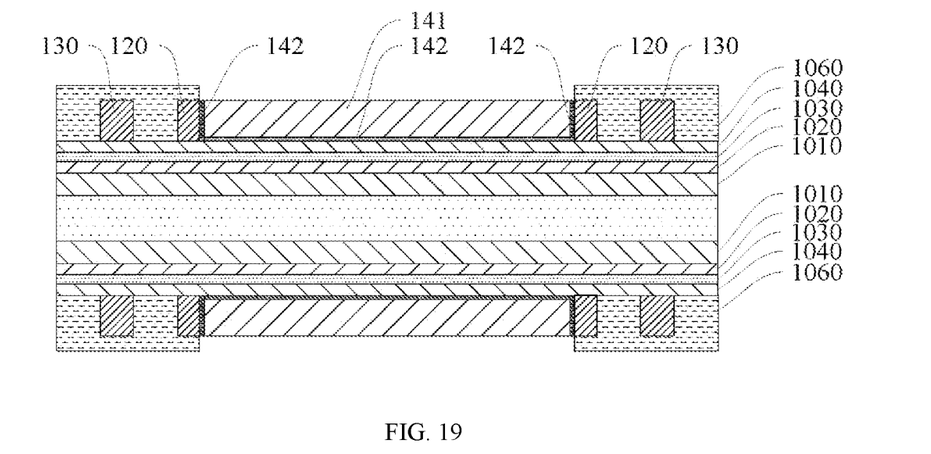
FIG. 19 is a schematic structural diagram of the semi-finished product shown in FIG. 18a after processing a first metal block.

At S140, referring to FIG. 19, electroplating is performed on the anti-etching barrier layer 142 to form the first metal block 141, so as to smooth the surface of the base plate 100 and facilitate the subsequent processing of each layer.

Figure 20:
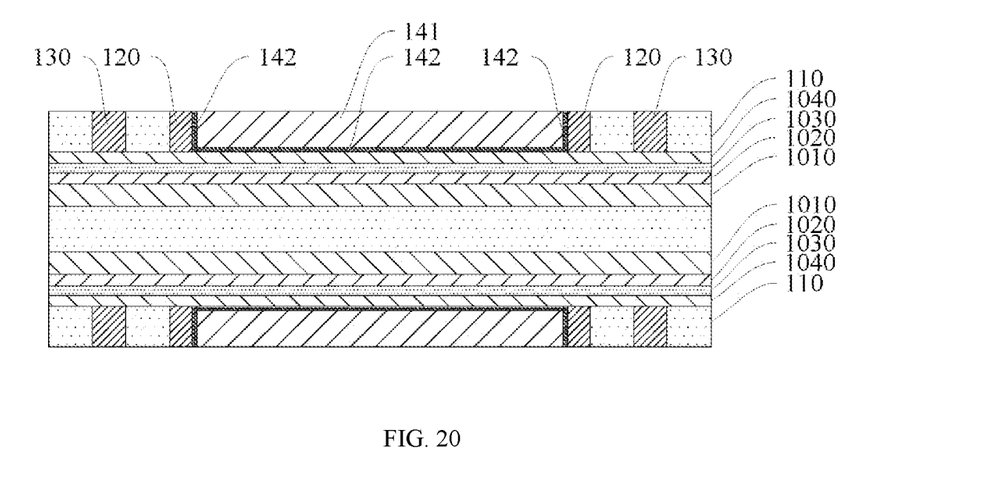
FIG. 20 is a schematic structural diagram of the semi-finished product shown in FIG. 19 after laminating.

At S150, referring to FIG. 20, the photosensitive shielding layer is removed, and a dielectric material is laminated to obtain the dielectric material layer 110.

At S160, the dielectric material layer 110 is thinned and then divided into plates to obtain the base plate 100, wherein the dielectric material layer 110 may be thinned by grinding plates to expose the first through-hole pillar 130 and the first metal block 141 on the base plate 100.

The embodiments of the present disclosure are described in detail with reference to the drawings above, but the present disclosure is not limited to the above embodiments, and various changes may also be made within the knowledge scope of those of ordinary skills in the art without departing from the purpose of the present disclosure.

What is claimed is:

1. A substrate manufacturing method for realizing three-dimensional packaging, comprising:

preparing a base plate, wherein the base plate comprises a dielectric material layer, a first sidewall pad and a first through-hole pillar arranged on the dielectric material layer, and a cavity penetrating both sides of the dielectric material layer, the cavity is filled with a first metal block, an anti-etching barrier layer is arranged between the first metal block and the dielectric material layer and at a bottom portion of the first metal block, the cavity is provided with at least one plane sidewall, and the first sidewall pad is located at one side of the plane sidewall and connected with the anti-etching barrier layer;

processing a first circuit layer and a second circuit layer on the base plate, wherein the first circuit layer comprises a first padding plate and a second metal block, the second circuit layer comprises a second padding plate and a plurality of pin pads, positions of the first padding plate and the second padding plate are all matched with the first through-hole pillar, the second metal block covers above the cavity, and the plurality of pin pads are located at a bottom portion of the cavity;

processing and laminating interlayer through-hole pillars on the first circuit layer to produce a semi-finished product, wherein the interlayer through-hole pillars comprise a first interlayer through-hole pillar, a second interlayer through-hole pillar, a third interlayer through-hole pillar and a fourth interlayer through-hole pillar, the first interlayer through-hole pillar is arranged on the first padding plate, the second interlayer through-hole pillar is arranged on the second metal block, the third interlayer through-hole pillar is arranged on the second padding plate, and the fourth interlayer through-hole pillar is arranged on at least one of the pin pads;

processing a third circuit layer and a fourth circuit layer on the semi-finished product obtained after laminating, wherein the third circuit layer comprises a second sidewall pad, a position of the second sidewall pad is matched with the first sidewall pad, and the second sidewall pad is connected with the first interlayer through-hole pillar, the fourth circuit layer comprises a routing circuit, and the routing circuit is respectively connected with the third interlayer through-hole pillar and the fourth interlayer through-hole pillar; and etching the second interlayer through-hole pillar, the second metal block, the first metal block and the anti-etching barrier layer respectively to expose the first sidewall pad, the second sidewall pad and the pin pads.

2. The substrate manufacturing method for realizing three-dimensional packaging of claim 1, wherein the first sidewall pad is a copper pillar with a square cross section.

3. The substrate manufacturing method for realizing three-dimensional packaging of claim 1, wherein the first through-hole pillar is a cylindrical copper pillar.

4. The substrate manufacturing method for realizing three-dimensional packaging of claim 1, wherein the manufacturing method of the base plate comprises:

preparing a double-sided copper foil substrate, and manufacturing a third seed layer on the double-sided copper foil substrate;

processing the first sidewall pad and the first through-hole pillar on the double-sided copper foil substrate with the third seed layer;

manufacturing a photosensitive shielding layer on the double-sided copper foil substrate with the first sidewall pad and the first through-hole pillar to form the cavity, and electroplating the anti-etching barrier layer in the cavity;

electroplating on the anti-etching barrier layer to form the first metal block;

removing the photosensitive shielding layer and laminating a dielectric material to obtain the dielectric material layer; and thinning and then dividing the dielectric material layer into plates to obtain the base plate.

5. The substrate manufacturing method for realizing three-dimensional packaging of claim 4, wherein the manufacturing the third seed layer on the double-sided copper foil substrate comprises:

plating nickel on the double-sided copper foil substrate to obtain a protective metal layer; and plating copper on the protective metal layer to obtain the third seed layer.

6. The substrate manufacturing method for realizing three-dimensional packaging of claim 1, wherein the processing the third circuit layer and the fourth circuit layer on the semi-finished product obtained after laminating comprises:

manufacturing a second seed layer on the semi-finished product obtained after laminating; and processing the third circuit layer and the fourth circuit layer on the second seed layer by pattern transfer and pattern electroplating.

7. The substrate manufacturing method for realizing three-dimensional packaging of claim 6, wherein the first sidewall pad is a copper pillar with a square cross section.

8. The substrate manufacturing method for realizing three-dimensional packaging of claim 6, wherein the first through-hole pillar is a cylindrical copper pillar.

9. The substrate manufacturing method for realizing three-dimensional packaging of claim 1, wherein the processing the first circuit layer and the second circuit layer on the base plate comprises:

manufacturing a first seed layer on the base plate; and processing the first circuit layer and the second circuit layer on the first seed layer by pattern transfer and pattern electroplating.

10. The substrate manufacturing method for realizing three-dimensional packaging of claim 9, wherein the first sidewall pad is a copper pillar with a square cross section.

11. The substrate manufacturing method for realizing three-dimensional packaging of claim 9, wherein the first through-hole pillar is a cylindrical copper pillar.

12. The substrate manufacturing method for realizing three-dimensional packaging of claim 9, wherein the processing the interlayer through-hole pillars on the first circuit layer comprises:

processing the interlayer through-hole pillars on the first circuit layer and the second circuit layer by pattern transfer and pattern electroplating; and etching the first seed layer to obtain a circuit pattern matched with the first circuit layer and the second circuit layer.

13. The substrate manufacturing method for realizing three-dimensional packaging of claim 12, wherein the first sidewall pad is a copper pillar with a square cross section.

14. The substrate manufacturing method for realizing three-dimensional packaging of claim 12, wherein the first through-hole pillar is a cylindrical copper pillar.

15. The substrate manufacturing method for realizing three-dimensional packaging of claim 1, wherein after etching the second interlayer through-hole pillar, the second metal block, the first metal block and the anti-etching barrier layer respectively, the method further comprises:

performing solder resist treatment on the third circuit layer and the fourth circuit layer; and performing metal surface treatment on the first sidewall pad, the second sidewall pad and the pin pads.

16. The substrate manufacturing method for realizing three-dimensional packaging of claim 15, wherein the first sidewall pad is a copper pillar with a square cross section.

17. The substrate manufacturing method for realizing three-dimensional packaging of claim 15, wherein the first through-hole pillar is a cylindrical copper pillar.

18. The substrate manufacturing method for realizing three-dimensional packaging of claim 15, wherein after the performing solder resist treatment on the third circuit layer and the fourth circuit layer, the method further comprises:

welding a passive device on the sidewall of the cavity, wherein pins of the passive device are respectively connected with the first sidewall pad and the second sidewall pad;

welding an active device in the cavity, wherein pins of the active device are respectively connected with the pin pads; and packaging the cavity welded with the passive device and the active device.

19. The substrate manufacturing method for realizing three-dimensional packaging of claim 18, wherein the first sidewall pad is a copper pillar with a square cross section.

20. The substrate manufacturing method for realizing three-dimensional packaging of claim 18, wherein the first through-hole pillar is a cylindrical copper pillar.

* * * * *